(12) United States Patent
Ko et al.

(10) Patent No.: US 9,604,240 B2
(45) Date of Patent: Mar. 28, 2017

(54) MASK ASSEMBLY AND METHOD OF FABRICATING THE SAME

(71) Applicant: Samsung Display Co., Ltd., Yongin (KR)

(72) Inventors: Jung Woo Ko, Gwangju-si (KR); Taek Kyo Kang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/216,516

(22) Filed: Mar. 17, 2014

(65) Prior Publication Data

US 2015/0007767 A1    Jan. 8, 2015

(30) Foreign Application Priority Data

Jul. 8, 2013    (KR) ........................ 10-2013-0079790

(51) Int. Cl.
*B05B 15/04* (2006.01)
*B05C 21/00* (2006.01)
*C23C 14/04* (2006.01)
*H01L 51/00* (2006.01)

(52) U.S. Cl.
CPC ........ *B05B 15/0481* (2013.01); *B05C 21/005* (2013.01); *C23C 14/042* (2013.01); *H01L 51/0011* (2013.01); *Y10T 29/49826* (2015.01)

(58) Field of Classification Search
None
See application file for complete search history.

(56) References Cited

U.S. PATENT DOCUMENTS

| 2004/0020435 | A1* | 2/2004 | Tsuchiya | C23C 14/042 118/723 VE |
| 2007/0163494 | A1* | 7/2007 | Tokie | C23C 14/042 118/301 |
| 2012/0325143 | A1* | 12/2012 | Kang | C23C 14/042 118/504 |
| 2015/0068456 | A1* | 3/2015 | Kuriyama | C23C 14/042 118/505 |

FOREIGN PATENT DOCUMENTS

| KR | 10-2009-0003014 | 1/2009 | |
| KR | 10-2012-0080857 | 7/2012 | |
| KR | 10-2012-0119051 | 10/2012 | |
| WO | WO 2013/150699 A1 * | 10/2013 | ........... C23C 14/042 |

* cited by examiner

*Primary Examiner* — Dah-Wei D Yuan
*Assistant Examiner* — Jethro M Pence
(74) *Attorney, Agent, or Firm* — H.C. Park & Associates, PLC

(57) ABSTRACT

Provided are a mask assembly and a method of fabricating the same. The mask assembly includes a mask frame in which a frame opening is formed therein and insulation grooves are formed at both sides of a first direction with the frame opening therebetween. The mask has both ends disposed at the both sides and includes a plurality of pattern open parts configured by a plurality of pattern openings between the both ends. A movement member is provided in the insulation groove, to which the both ends of the mask are fixed, and which includes a movement block moving in the first direction and a second direction intersecting the first direction.

11 Claims, 25 Drawing Sheets

MASK ASSEMBLY AND METHOD OF FABRICATING THE SAME

CROSS-REFERENCE TO RELATED APPLICATION

This application claims priority from Korean Patent Application No. 10-2013-0079790 filed on Jul. 8, 2013 which is hereby incorporated by reference for all purposes as if fully set forth herein.

BACKGROUND

Field of the Invention

Exemplary embodiments of the present invention relate to a mask assembly and a method of fabricating the same.

Description of the Background

Among display devices, an organic light emitting display device is a self-emitting display device and has drawn attention as a next generation display device due to a wide viewing angle, excellent contrast, and a rapid response speed.

Such an organic light emitting display device may include an intermediate layer which may include at least a light emitting layer between opposing electrodes for every pixel. The electrodes and the intermediate layer may be formed by several methods including a deposition method.

In order to fabricate the organic light emitting display device using the deposition method, it may be required that a mask having a pattern of an opening same as the pattern of a thin film which will be formed on a substrate. For example, a process may be required that a fine metal mask (FMM) is closely attached onto the substrate and a deposition material is deposited onto the substrate through the mask to form a thin film having a desired pattern.

Generally, the mask is welded to be coupled onto the mask frame while being extended to form a mask assembly and then used for a deposition process which deposits a deposition material on the substrate to form a thin film.

However, when an extending or a welding process for the mask is not precisely performed, an opening of the mask is not disposed in a predetermined position on the mask frame after coupling the mask with the mask frame and minutely deviates from the predetermined position. For example, on the mask frame, one opening of the mask does not correspond to one pixel (that is, a pixel which needs to correspond to one opening of the mask) of the substrate to be disposed on an upper portion of the mask, which may cause a thin film deposition error of the substrate during the depositing process.

Further, after coupling the mask with the mask frame, wrinkles may be generated in the mask. For example, wrinkles may be generated at both ends of the mask or around a welded point due to the extending or welding process of the mask. The wrinkles spread to the opening of the mask so that the opening of the mask is not disposed in a predetermined position on the mask frame and minutely deviates from the predetermined position, which may also cause the thin film deposition error of the substrate during the depositing process.

Therefore, the present invention has been made in an effort to provide a mask assembly which corrects the deviated position of the pattern opening of the mask on the mask frame to increase a thin film depositing quality of the substrate.

The present invention has been made in an effort to further provide a method of fabricating a mask assembly which corrects the deviated position of the pattern opening of the mask on the mask frame to increase a thin film depositing quality of the substrate.

The above information disclosed in this Background section is only to set up Applicant's recognition of problems within existing art and merely for enhancement of understanding of the background of the invention based on the identified source of problems, and therefore the above information cannot be used as prior art in determining obviousness into the present invention.

SUMMARY

Exemplary embodiments of the present invention provide a mask assembly and method of fabricating the same.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a mask assembly. The mask assembly includes a mask frame comprising a frame opening and grooves disposed at opposite sides of the frame opening. The mask includes two ends and a plurality of pattern open parts comprising a plurality of pattern openings disposed between the both ends. The mask assembly includes a movement member disposed in the groove, to which the two ends of the mask are fixed, the movement member comprising a movement block configured to move in a first direction and a second direction intersecting the first direction.

Exemplary embodiments of the present invention disclose a method of fabricating a mask assembly. The method includes disposing a movement member comprising a mask frame in which a frame opening is disposed therein and n grooves disposed at opposite sides of the frame opening. The method includes disposing a mask comprising two ends and a plurality of pattern open parts comprising a plurality of pattern openings disposed between the both ends. The method includes disposing a movement member, in the groove, to which the two ends of the mask are fixed, the movement member comprising a movement block configured to move in a first direction and a second direction intersecting the first direction. The method also includes fixing the two ends of the mask to the movement block while extending the mask in the first direction. The method includes moving the movement block in at least one of the first direction and the second direction to correct a position of a pattern opening of the mask when the pattern opening of the mask deviates from a predetermined position on the mask frame.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

A mask assembly and a method of fabricating a mask are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, and third may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, exemplary embodiments of the present invention will be described with reference to the drawings.

Figure 1:
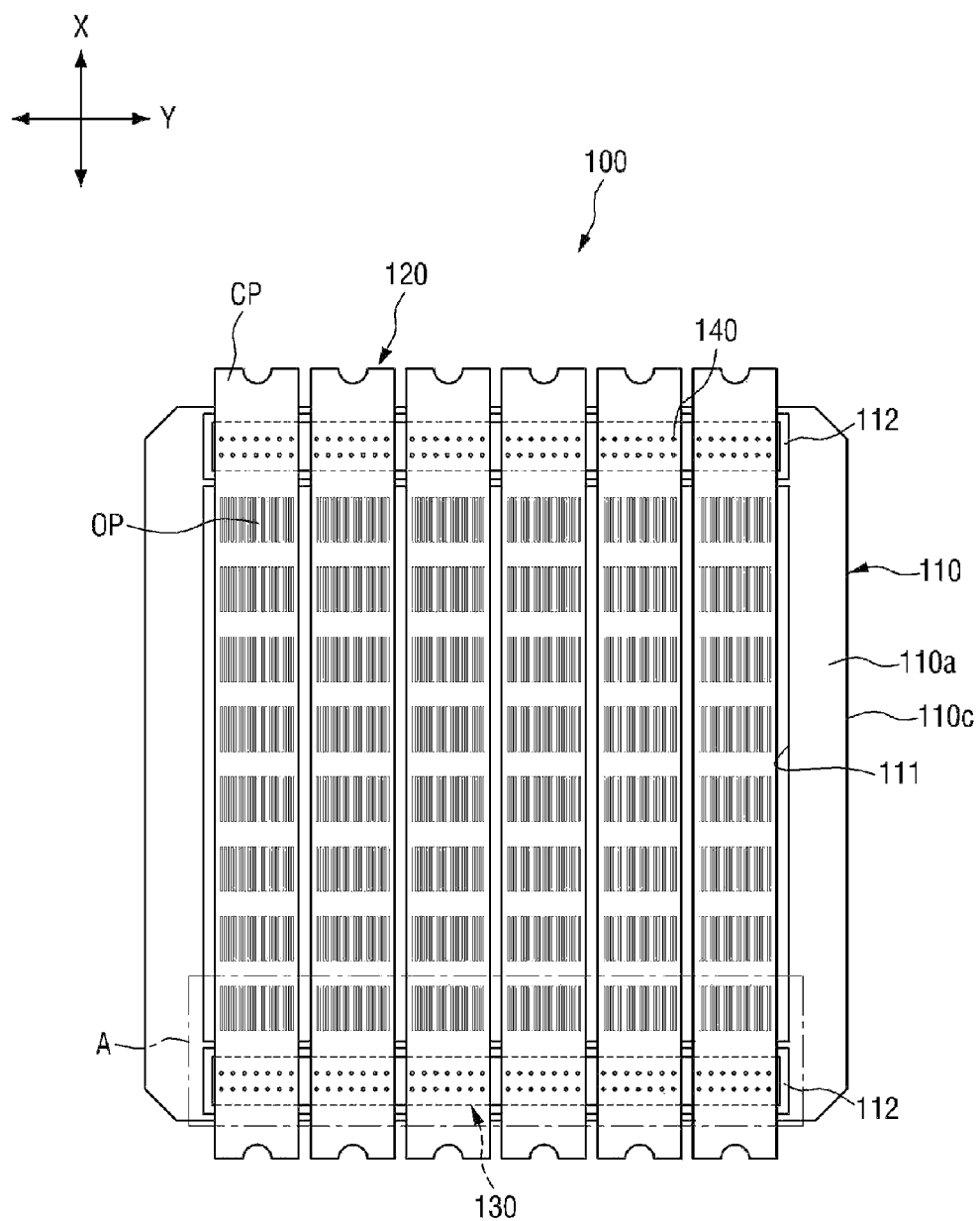
FIG. 1 is a plan view illustrating a mask assembly according to exemplary embodiments of the present invention.
Figure 2:
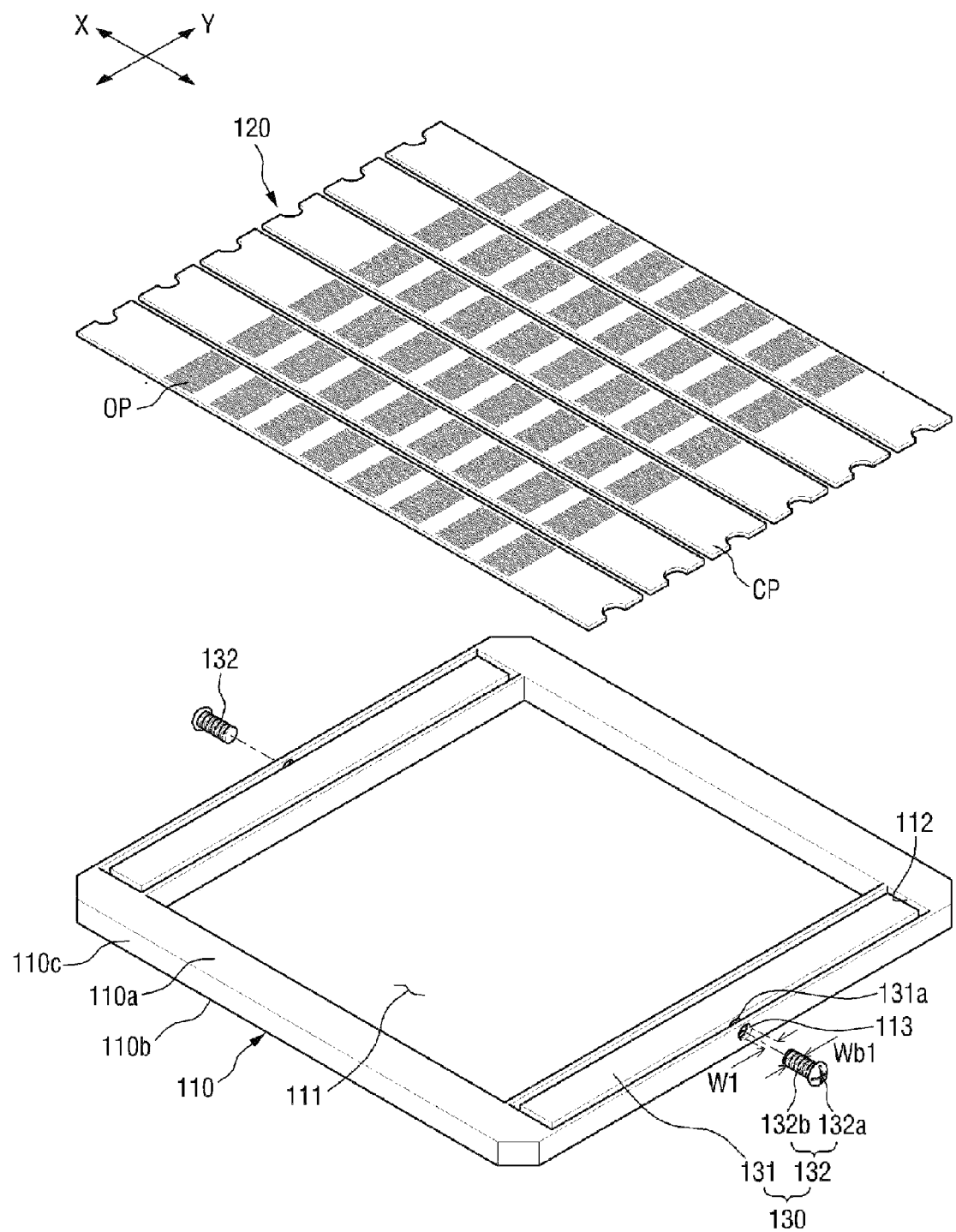
FIG. 2 is a perspective view of the mask assembly of FIG. 1.
Figure 3:
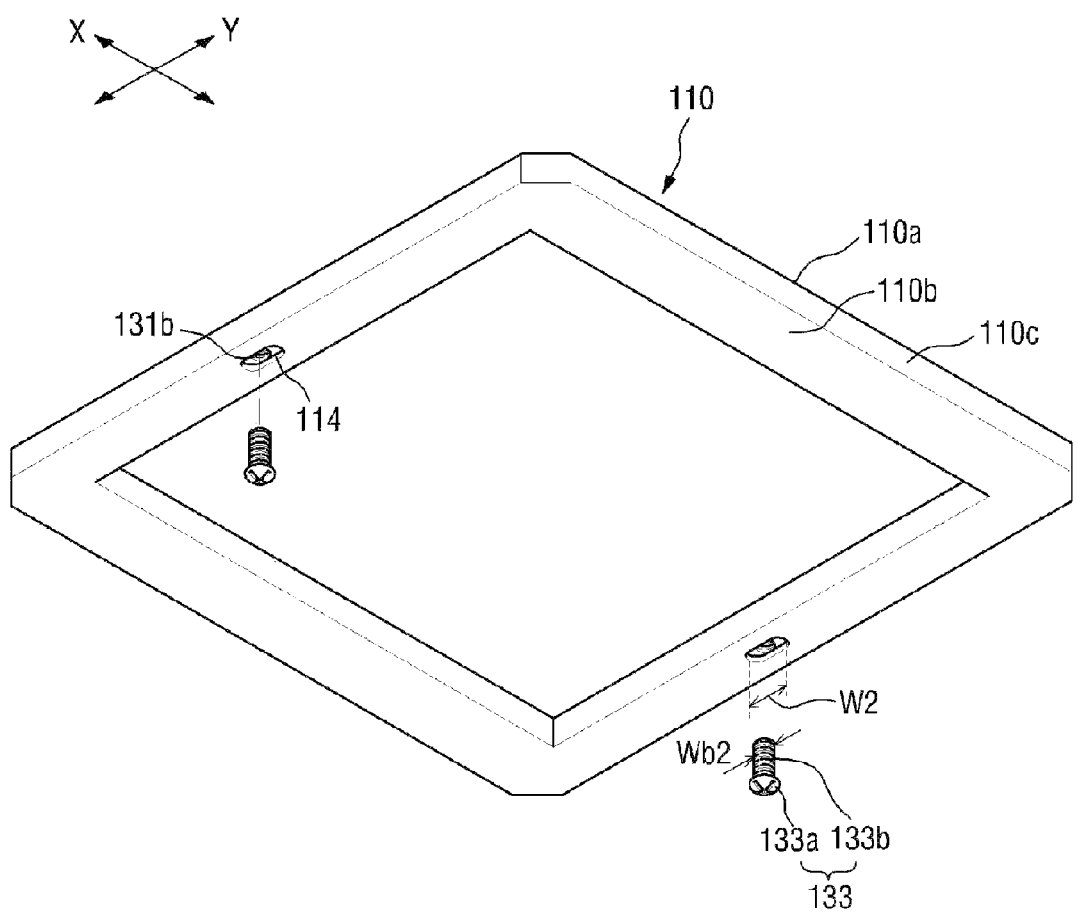
FIG. 3 is a perspective view illustrating a bottom surface of a mask frame of FIG. 2.
Figure 4:
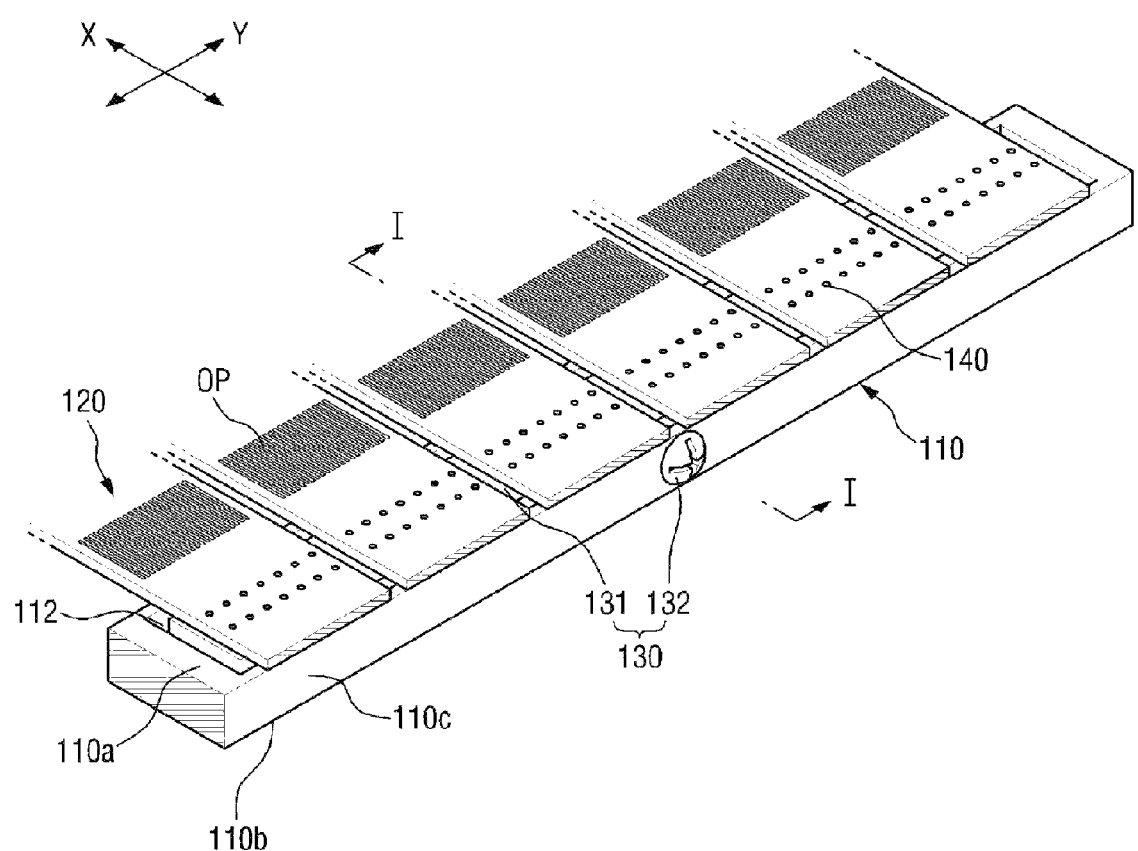
FIG. 4 is an enlarged perspective view of portion "A" of FIG. 1.
Figure 5:
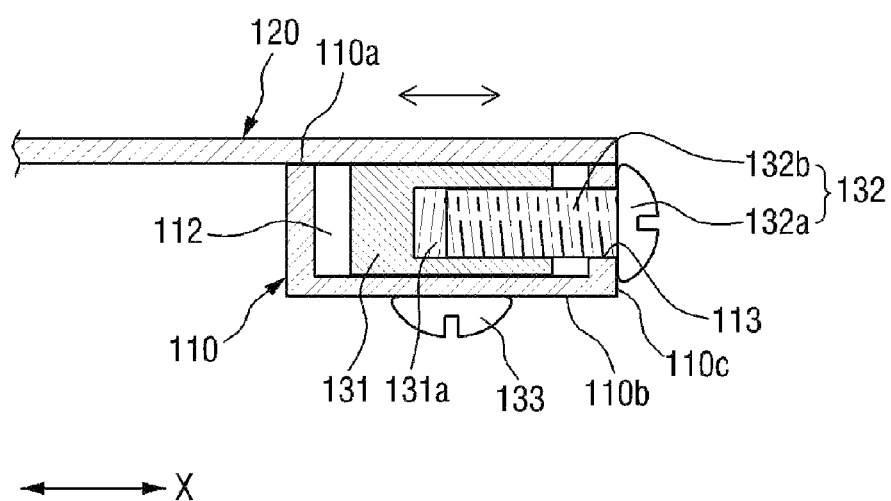
FIG. 5 is a cross-sectional view taken along line I-I of FIG. 4.
Figure 6:
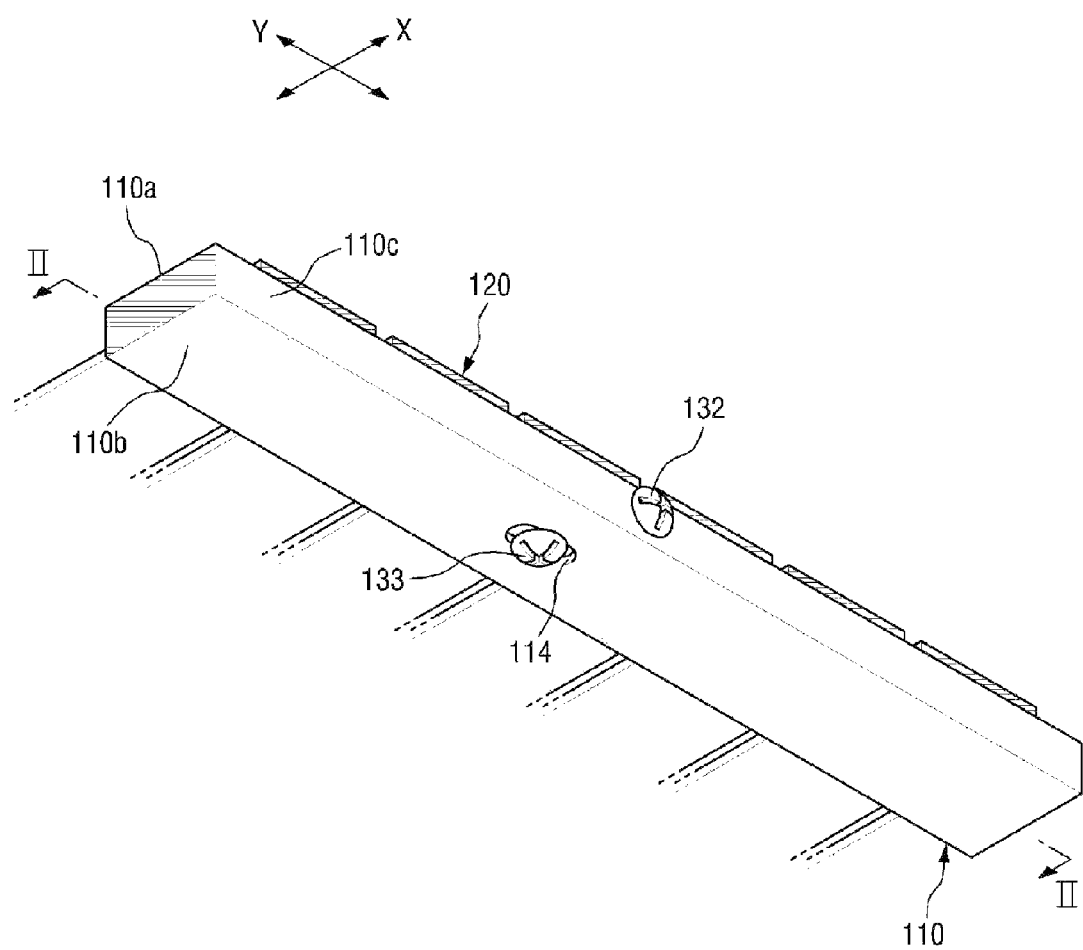
FIG. 6 is an enlarged perspective view illustrating a bottom surface of portion "A" of FIG. 1.
Figure 7:
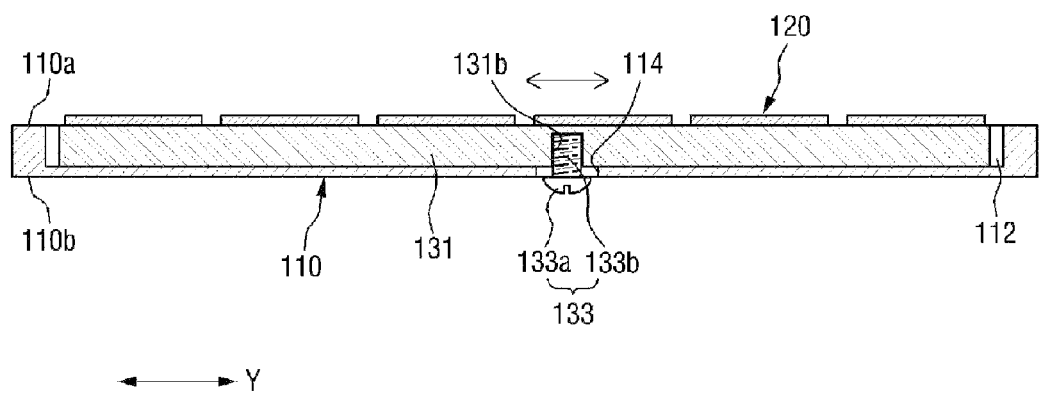
FIG. 7 is a cross-sectional view taken along line II-II of FIG. 6.

FIG. 1 is a plan view illustrating a mask assembly according to exemplary embodiments of the present invention. FIG. 2 is a perspective view of the mask assembly of FIG. 1. FIG. 3 is a perspective view illustrating a bottom surface of a mask frame of FIG. 2. FIG. 4 is an enlarged perspective view of portion "A" of FIG. 1. FIG. 5 is a cross-sectional view taken along line I-I of FIG. 4. FIG. 6 is an enlarged perspective view illustrating a bottom surface of portion "A" of FIG. 1. FIG. 7 is a cross-sectional view taken along line II-II of FIG. 6.

Referring to FIGS. 1 to 3, the mask assembly 100 according to exemplary embodiments of the present invention may include a mask frame 110, a mask 120, and a movement member 130.

The mask frame 110 forms an outer frame of the mask assembly 100 and has a quadrangular stripe shape having a frame opening 111 formed therein. The mask frame 110 may be formed of a metal material having a large rigidity, for example, a metal such as stainless steel. The mask frame 110 may include a top surface 110a, a bottom surface 110b, and sides 110c which connect the top surface 110a and the bottom surface 110b.

The mask frame 110 may include insulation grooves 112 formed at both sides (for example, both sides at which the mask 120 is welded) in a first direction X with a frame opening 111 therebetween. The insulation groove 112 is formed along a second direction Y which intersects the first direction X and formed to be recessed from the top surface 110a to the bottom surface 110b of the mask frame 110. The insulation groove 112 provides a space where a movement block 131 of a movement member 130 is provided. The mask frame 110 may support the mask 120 which is welded to be fixed onto the movement block 131.

The mask frame 110 may include first through hole 113 which is formed on side surfaces of both sides of the first direction X and second through hole 114 which is formed on bottom surfaces of the both sides of the first direction X. The first through hole 113 forms a passage through which a first screw 132 of the movement member 130 passes to be coupled with the side of the movement block 131 and the second through hole 114 forms a passage through which a second screw 133 passes to be coupled with the bottom surface of the movement block 131.

The mask 120 is disposed on the mask frame 110 so as to cover the frame opening 111. Specifically, both ends of the mask 120 are disposed at both sides of the mask frame 110 in the first direction X. The both ends of the mask 120 are welded to be fixed onto the movement block 131 which is provided in the insulation groove 112 of the mask frame 110.

The mask 120 may include a plurality of pattern open parts OP. The plurality of pattern open parts OP may be disposed in parallel to have an interval therebetween along the first direction X. The plurality of pattern open parts OP may correspond to the frame opening 111. Each pattern of the open parts OP has a plurality of pattern openings and each of the plurality of pattern openings may have a shape corresponding to a shape of a thin film to be deposited onto a substrate (not illustrated) which may be disposed on the mask 120. By doing this, during depositing deposition process, a deposition material is deposited onto the substrate through the pattern open parts OP so that a thin film (for example, an organic light emitting layer or a metal layer) having a desired shape may be formed.

One of the pattern open parts OP may correspond to one flat panel display device (for example, an organic light emitting display device). In this example, patterns for a plurality of flat panel display devices may be simultaneously deposited by a single process using one mask assembly 100.

The mask 120 may include a clamping part CP which protrudes in the first direction X so as to be coupled with a clamp (not illustrated) which applies a tension to the both ends in the first direction X. The clamping part CP is cut to be removed from the mask 120 after forming the mask assembly 100.

For example, the mask 120 may be formed of a metal thin film such as nickel (Ni), a nickel alloy, or a nickel-cobalt alloy. In FIGS. 1 and 2, even though it is illustrated that a plurality of pattern open parts OP are formed to have a slit pattern, the plurality of pattern open parts OP may be formed to have a dot pattern or both the slit pattern and the dot pattern. Further, referring to FIGS. 1 and 2, it is illustrated that a plurality of pattern open parts OP are configured by a plurality of divided masks which are divided along the second direction, but it is not limited to the divided masks. For example, the mask 120 may be configured by one mother mask in which a plurality of pattern open parts OP are not divided. By way of illustration, it is described that the mask 120 is configured by the plurality of divided masks.

The movement member 130 fixes the mask 120 onto the mask frame 110 and corrects a position of the pattern opening of the mask 120 so that the movement member 130 may include the movement block 131, the first screw 132, and the second screw 133.

The movement block 131 is provided in the insulation groove 112 of the mask frame 110. The movement block 131 may be formed as one body and provides a space where both ends of the mask 120 which is configured by the plurality of divided masks are welded. Accordingly, in a case when an extending process or a welding process of the mask 120 is not precisely performed or the mask 120 has wrinkles so that a position of the pattern openings of a part of the mask 120 which is configured by the plurality of divided masks on the mask frame 110 minutely deviates from a predetermined position, the movement block 131 moves the whole mask 120 to the first direction X or the second direction Y to correct the position of the pattern opening of the mask 120. Even in a case when the mask 120 is configured by one mother mask, and when an extending process or a welding process of the mask 120 is not precisely performed or the mask 120 has wrinkles so that a position of the pattern openings of a part of the mask 120 which is configured by one mother mask on the mask frame 110 minutely deviates from a predetermined position, the movement block 131 minutely moves the whole mask 120 to the first direction X or the second direction Y to correct the position of the pattern opening of the mask 120.

The movement block 131 may have an area which is smaller than an area of the insulation groove 112 and thus a space where the movement block 131 moves in the first direction X and the second direction Y in the insulation groove 112 may be provided.

The first screw 132 is coupled with the side surfaces of both sides of the mask frame 110 on which both ends of the mask 120 are disposed and the side surface of the movement block 131. That is, the first screw 132 passes through the first through hole 113 to be coupled with the side surface of the movement block 131. Referring to FIGS. 2 and 5, a first coupling groove 131a is formed at the side surface of the movement block 131 so as to be coupled with the first screw 132.

The first screw 132 may fix the movement block 131 in the insulation groove 112. Further, the first screw 132 rotates clockwise or counterclockwise to move the movement block 131 in the first direction X to be apart from or close to each side surface of both sides of the mask frame 110.

The first screw 132 may include a first head part 132a and a first body part 132b which is coupled to the first head part 132a to pass through the first through hole 113. In this example, when the movement block 131 horizontally moves in the first direction X, the first screw 132 also horizontally moves in the first direction X so that a width W1 of the first through hole 113 is equal to or larger than a width Wb1 of the first body part 132b in the second direction Y without any restrictions. Referring to FIG. 2, one first screw 132 is provided, but two or more first screws 132 may be provided by way of configurations.

The second screw 133 is coupled with bottom surfaces of the both sides of the mask frame 110 in which both ends of the mask 120 are disposed and the bottom surface of the movement block 131. In this example, the second screw 133 passes through the second through hole 114 to be coupled with the bottom surface of the movement block 131. Referring to FIGS. 3 and 7, a second coupling groove 131b is formed on the bottom surface of the movement block 131 so as to be coupled with the second screw 133.

The second screw 133 may fix the movement block 131 in the insulation groove 112 together with the first screw 132. Further, the second screw 133 rotates counterclockwise (or clockwise) to be loosened from the movement block 131 and then the movement block 131 is moved to the second direction Y by an operator. Thereafter, the second screw 133 rotates clockwise (or counterclockwise) to be fastened to the movement block 131. In this example, before the second screw 133 rotates counterclockwise (or clockwise) to be loosened from the movement block 131, the first screw 132 also rotates counterclockwise (or clockwise) to be loosened from the movement block 131, so that the operator may easily move the movement block 131 to the second direction Y. Further, after the second screw 133 rotates clockwise (or counterclockwise) to be fastened to the movement block 131, the first screw 132 rotates clockwise (or counterclockwise) to be fastened to the movement block 131, which may move the movement block 131 to the second direction Y and then fix the movement block 131 in the insulation groove 112.

The second screw 133 may include a second head part 133a and a second body part 133b which is coupled with the second head part 133a to pass through the second through hole 114. In this example, when the movement block 131 horizontally moves in the second direction Y, the second screw 133 also horizontally moves in the second direction Y so that a width W2 of the second through hole 114 is larger than a width of the second body part 133b in the second direction Y. In this example, a difference between the width W2 of the second through hole 114 and the width Wb2 of the second body part 133b may be a distance at which the first movement block 131 can be movable in the second direction Y.

For example, the mask assembly 100 may further include a welding part 140. The welding part 140 may be formed by a spot welding process or a laser welding process and fixes both ends of the mask 120 and a surface of the movement block 131.

The mask assembly 100 according to the exemplary embodiments of the present invention may include the movement member 130 which includes the movement block 131 provided in the insulation groove 112 of the mask frame 110 so that the mask 120 can move in the first direction X and the second direction Y by moving the movement block 131.

Accordingly, when an extending process or a welding process of the mask 120 is not precisely performed or the mask 120 has wrinkles so that a position of the pattern opening of the mask 120 on the mask frame 110 minutely deviates from a predetermined position, for example, one pattern opening of the mask 120 does not correspond to one pixel of the substrate (not illustrated) which is disposed at the upper portion of the mask 120, the mask assembly 100 according to the exemplary embodiments of the present invention may correct the position of the pattern opening of the mask 120.

Therefore, according to exemplary embodiments of the present invention, in the mask assembly 100, the thin film deposition error of the substrate due to the deviated position of the pattern opening of the mask 120 may be reduced.

Next, a mask assembly 200 according to exemplary embodiments of the present invention will be described.

The mask assembly 200 according to exemplary embodiments of the present invention has the same configuration as the mask assembly 100 of FIG. 1 excepting only a mask frame 210 and a movement member 230. Therefore, the mask frame 210 and the movement member 230 of the mask assembly 200 according to will be mainly described and the same description may be omitted to avoid unnecessarily obscuring the present invention.

Figure 8:
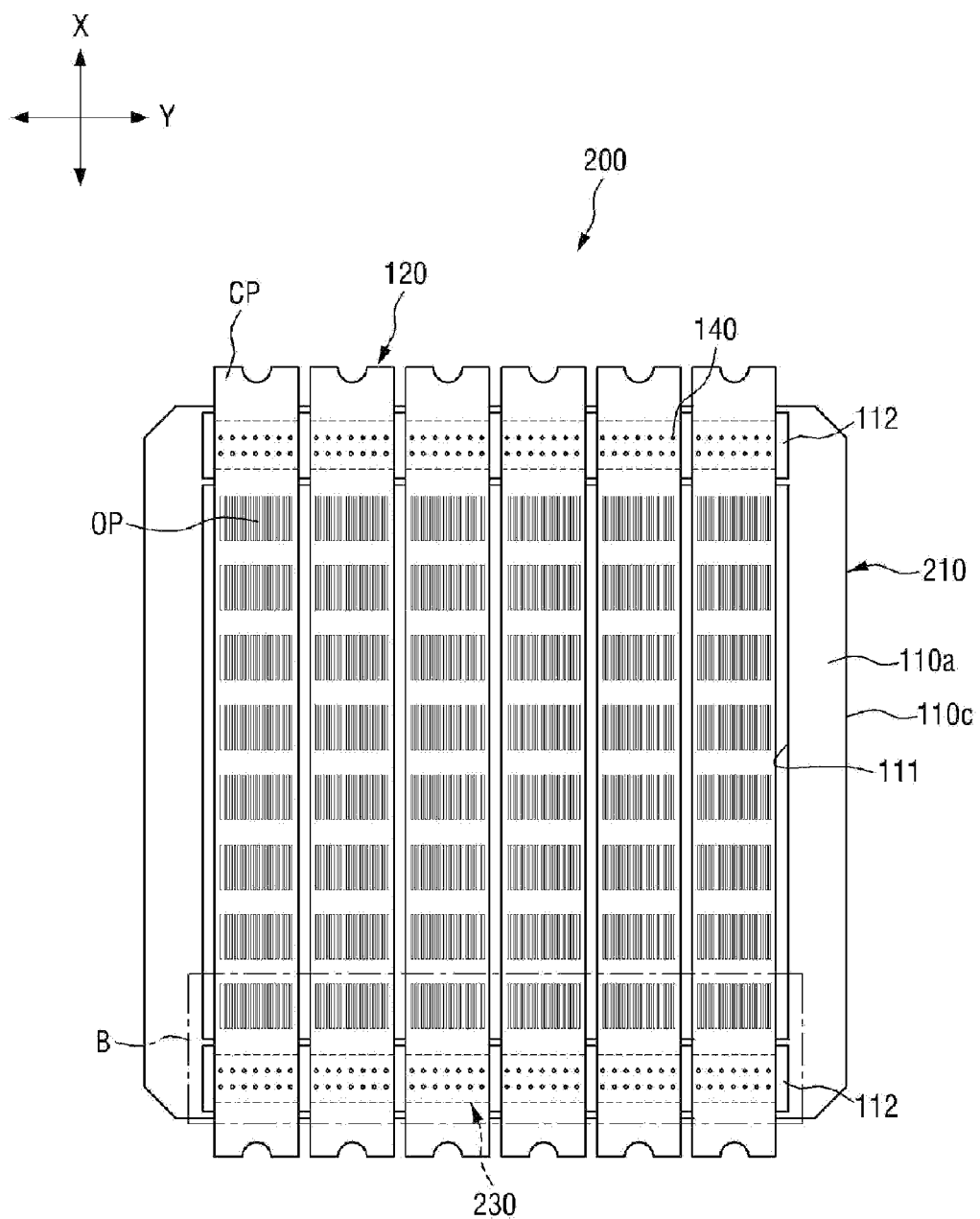
FIG. 8 is a plan view illustrating a mask assembly according to exemplary embodiments of the present invention.
Figure 9:
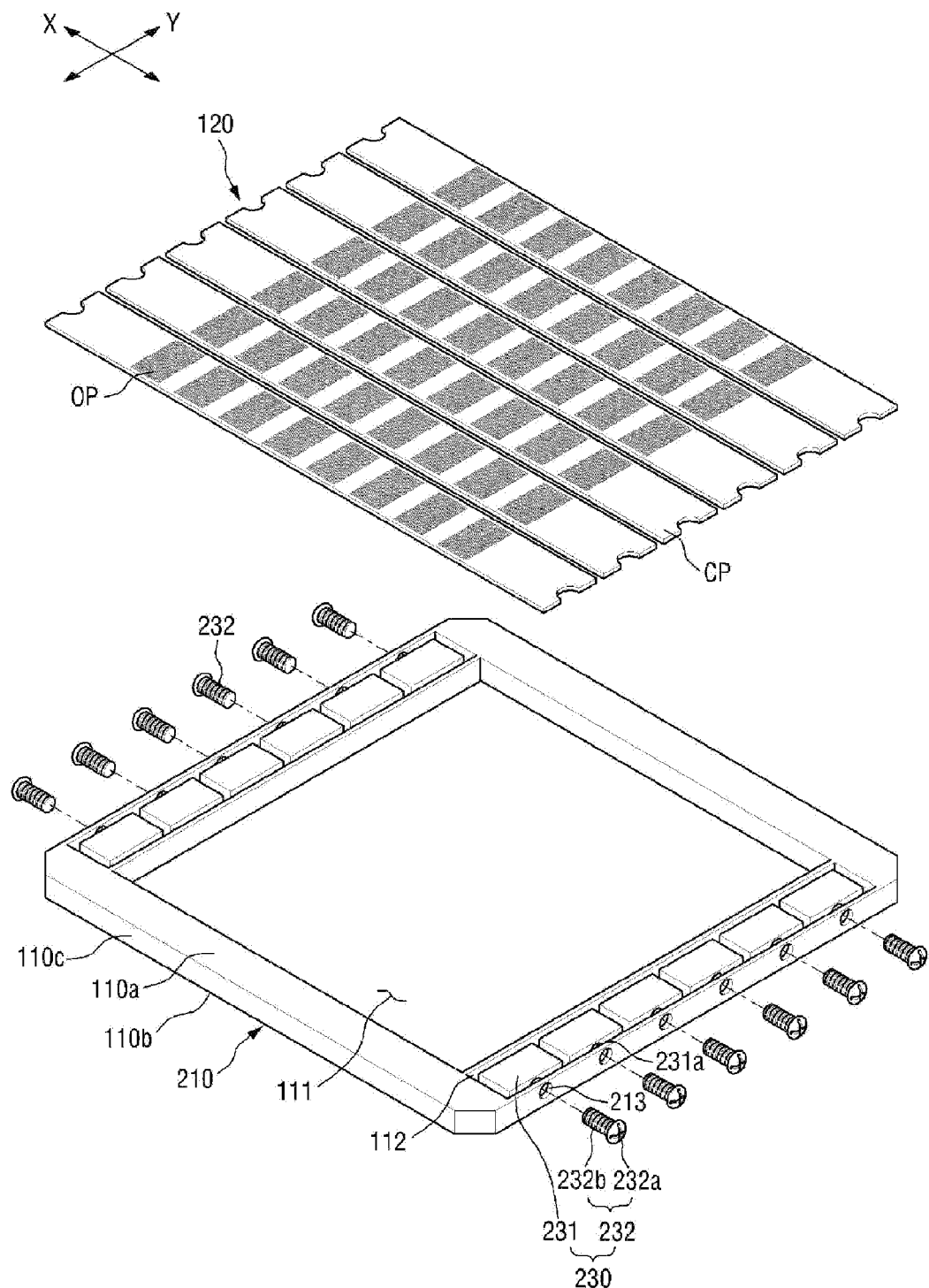
FIG. 9 is a perspective view of the mask assembly of FIG. 8.
Figure 10:
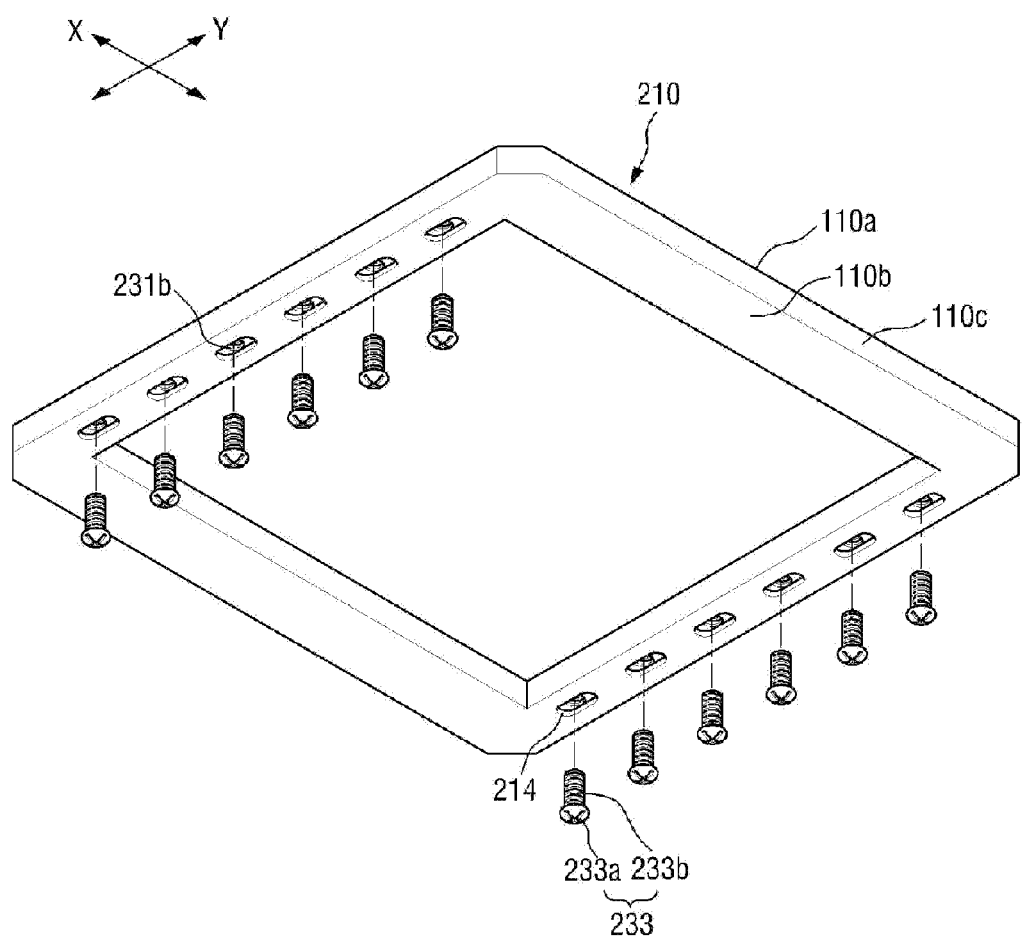
FIG. 10 is a perspective view illustrating a bottom surface of a mask frame of FIG. 9.
Figure 11:
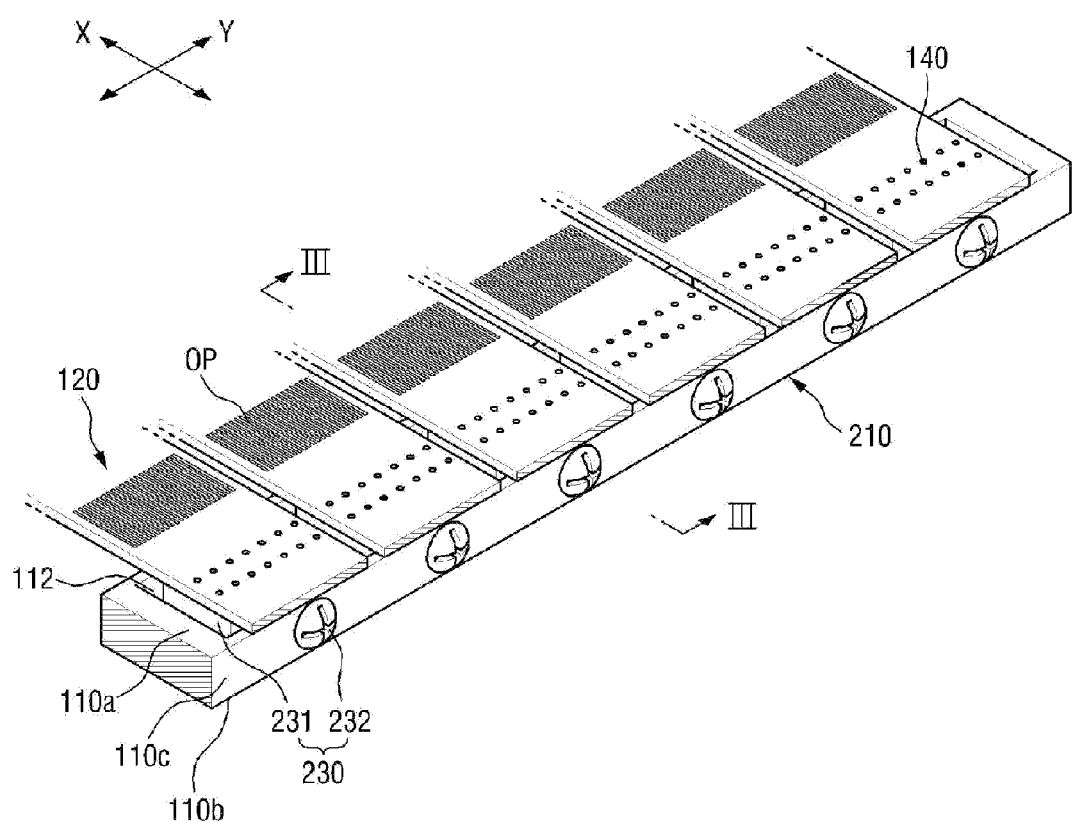
FIG. 11 is an enlarged perspective view of portion "B" of FIG. 8.
Figure 12:
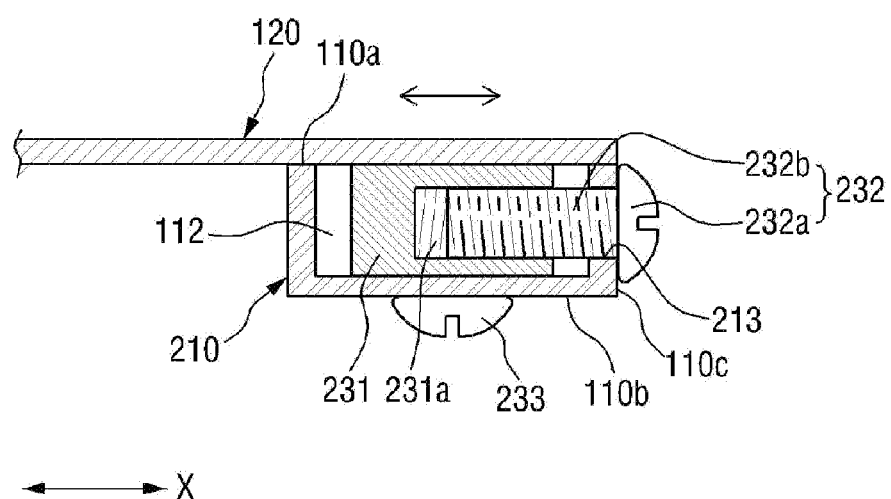
FIG. 12 is a cross-sectional view taken along line III-III of FIG. 11.
Figure 13:
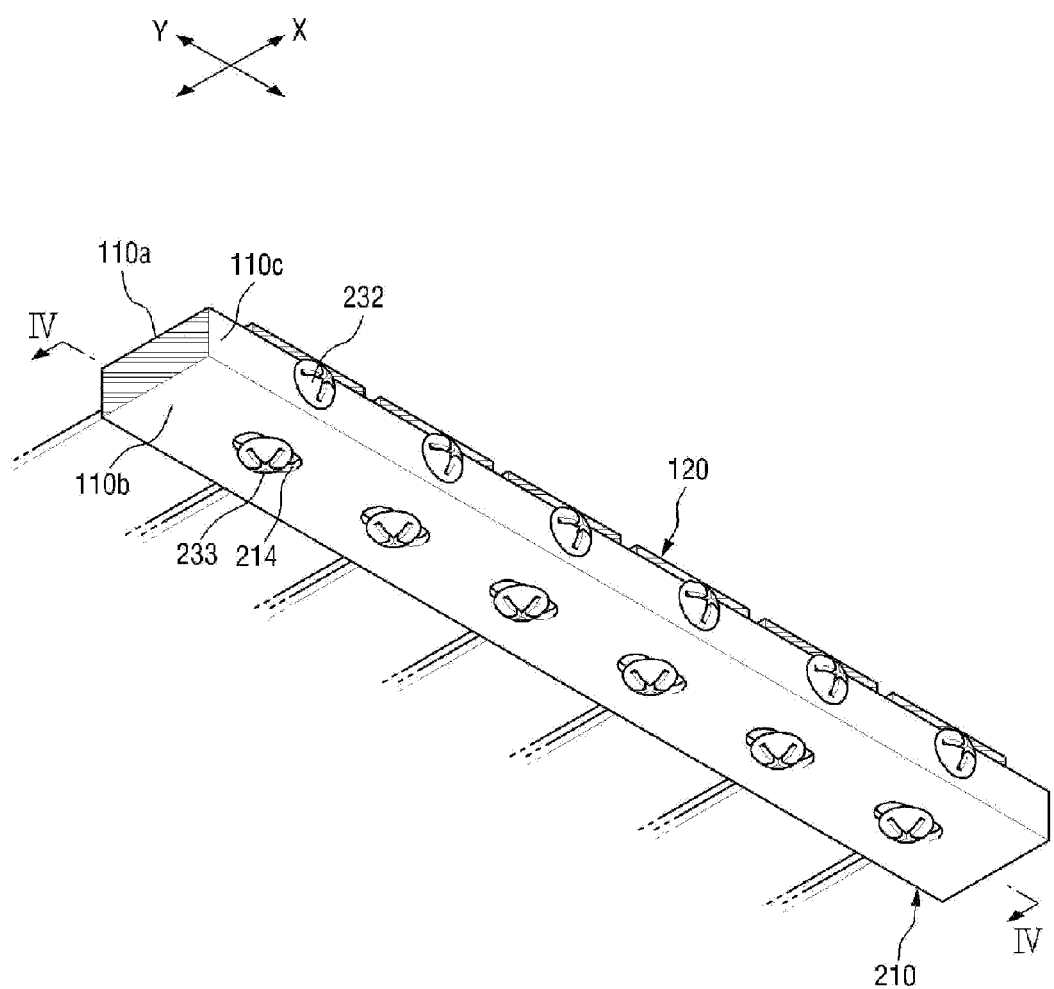
FIG. 13 is an enlarged perspective view illustrating a bottom surface of portion "B" of FIG. 8.
Figure 14:
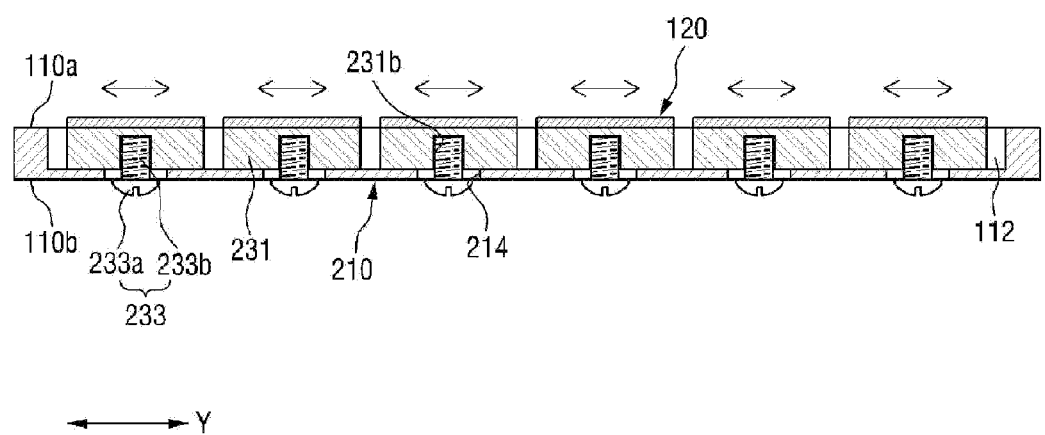
FIG. 14 is a cross-sectional view taken along line IV-IV of FIG. 13.

FIG. 8 is a plan view illustrating a mask assembly according to exemplary embodiments of the present invention. FIG. 9 is a perspective view of the mask assembly of FIG. 8. FIG. 10 is a perspective view illustrating a bottom surface of a mask frame of FIG. 9. FIG. 11 is an enlarged perspective view of portion "B" of FIG. 8. FIG. 12 is a cross-sectional view taken along line III-III of FIG. 11. FIG. 13 is an enlarged perspective view illustrating a bottom surface of portion "B" of FIG. 8. FIG. 14 is a cross-sectional view taken along line IV-IV of FIG. 13.

Referring to FIGS. 8 to 10, the mask assembly 200 according to exemplary embodiments of the present invention may include a mask frame 210, a mask 120, and a movement member 230.

The mask frame 210 may be similar to the mask frame 110 of FIG. 1. However, the mask frame 210 may include a plurality of first through holes 213 which may be formed at side surfaces of both sides of the first direction X and a plurality of second through holes 214 which may be formed on bottom surfaces of the both sides of the first direction X. The plurality of first through holes 213 may form a passage through which a plurality of first screws 232 of the movement member 230 passes to be coupled with a side surface of a movement block 231 and the plurality of second through holes 214 may form a passage through which a plurality of second screws 233 pass to be coupled with a bottom surface of the movement block 231.

The movement member 230 fixes the mask 120 on the mask frame 210 and corrects a position of a pattern opening of the mask 120 and may include the movement block 231, the first screw 232, and the second screw 233.

The movement block 231 may be provided in an insulation groove 112 of the mask frame 210. The movement block 231 may be configured by a plurality of divided blocks which may be arranged along the second direction Y and provide a space where both ends of the mask 120 are welded. In this example, when the mask 120 is configured by the plurality of divided masks or one mother mask, the plurality of divided masks and the plurality of divided blocks or one mother mask and the plurality of divided blocks may correspond to each other at a rate of 1:n (n is a natural number). For example, as illustrated in FIGS. 8 and 9, when the mask 120 is configured by the plurality of divided masks, the plurality of divided masks and the plurality of divided blocks may correspond to each other at the rate of 1:1. In this example, the plurality of divided blocks may correct the position of the pattern opening for every divided mask on the mask frame 210. By doing this, when an extending process or a welding process of any one of divided masks is not precisely performed or the divided mask has wrinkles so that a position of the pattern opening of the divided mask on the mask frame 210 deviates from a predetermined position, the divided mask is moved to the first direction X or the second direction Y by the divided block corresponding to the divided mask so that the position of the pattern opening of the divided mask may be corrected. Even when the mask 120 is configured by one mother mask, the plurality of divided blocks may correct the position of a specific portion of one mother mask on the mask frame 210.

For example, a total area of the plurality of divided blocks may be smaller than an area of the insulation groove 112, therefore a space where the plurality of divided blocks moves in the first direction X and the second direction Y in the insulation groove 112 may be provided.

The first screw 232 may include a first head part 232a and a first body part 232b and performs the same function as the first screw 132 of FIG. 2. However, the number of the first screws 232 may be the same as the number of the plurality of divided blocks. Referring to FIGS. 9 and 12, a first coupling groove 231a may be provided at a side surface of the movement block 231 so as to be coupled with the first screw 232.

The second screw 233 may include a second head part 233a and a second body part 233b and performs the same function as the second screw 133 of FIG. 2. However, the number of the second screws 233 may be the same as the number of the plurality of divided blocks. Referring to FIGS. 10 and 14, a second coupling groove 231b may be provided at a bottom surface of the movement block 231 so as to be coupled with the second screw 233.

As described above, the mask assembly 200 according to exemplary embodiments of the present invention may include a movement member 230 which is provided in the insulation groove 112 of the mask frame 210 and may include a movement block 231 configured by a plurality of divided blocks so as to move each divided mask of the mask 120 in the first direction X and the second direction Y by moving each of the plurality of divided blocks to correct the position of the pattern opening for every divided mask on the mask frame 210.

As a result, in the mask assembly 200 according to exemplary embodiments of the present invention, when an extending process or a welding process of the any one of divided masks is not precisely performed or the divided mask has wrinkles so that a position of the pattern opening of the divided mask minutely deviates from a predetermined position on the mask frame 210, the position of the pattern opening of the divided mask may be corrected.

Therefore, in the mask assembly 200 according to exemplary embodiments of the present invention, the thin film deposition error of the substrate caused by the deviated position of the pattern opening of the mask 120 may be reduced.

Next, a mask assembly 300 according to exemplary embodiments of the present invention will be described.

The mask assembly 300 according to exemplary embodiments of the present invention has the same configuration as the mask assembly 100 of FIG. 1 excepting only a mask frame 310 and a movement member 330. Therefore, the mask frame 310 and the movement member 330 of the mask assembly 300 according to exemplary embodiments of the present invention will be mainly described and the same description may be omitted to avoid unnecessarily obscuring the present invention.

Figure 15:
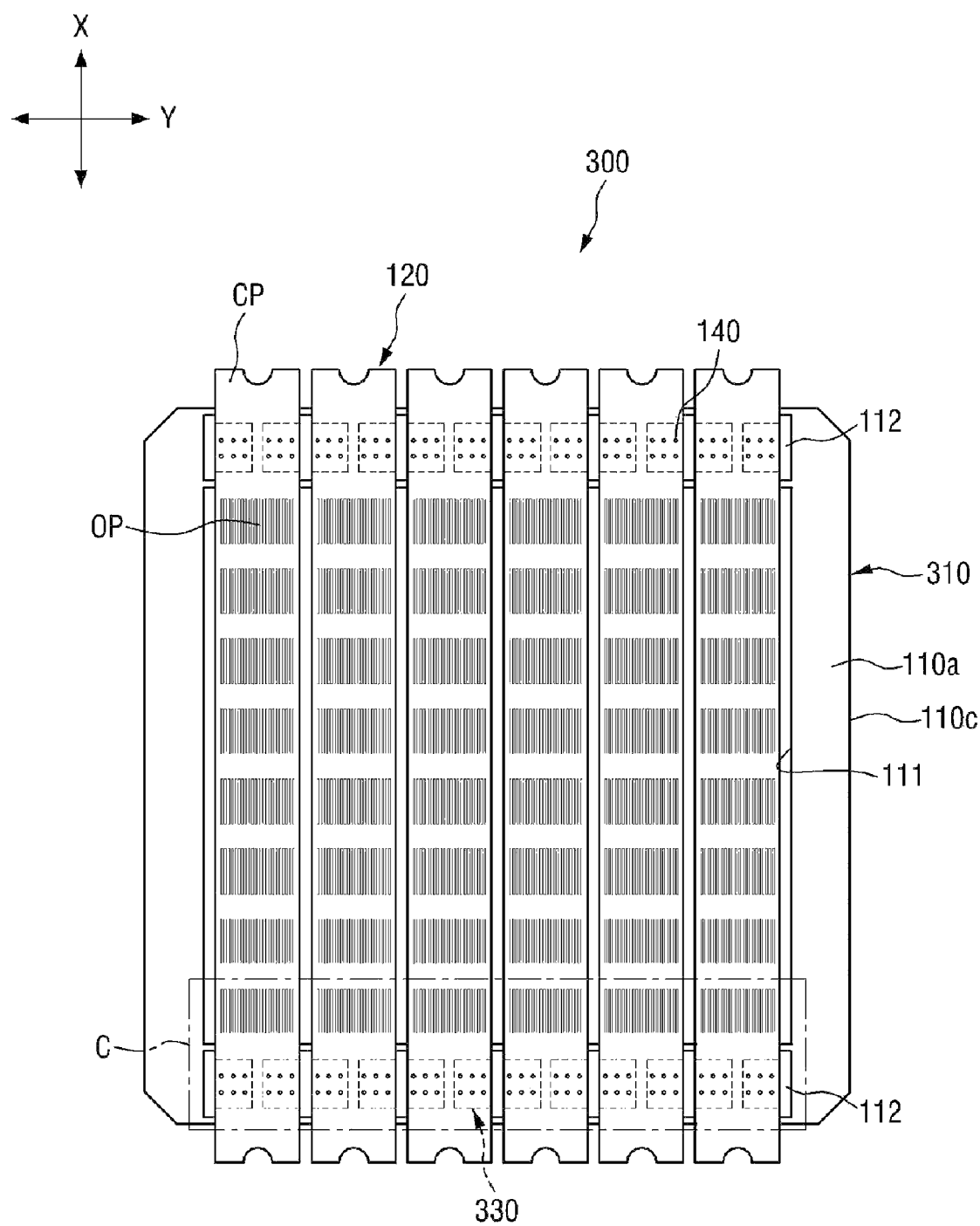
FIG. 15 is a plan view illustrating a mask assembly according to another embodiment of the present invention.
Figure 16:
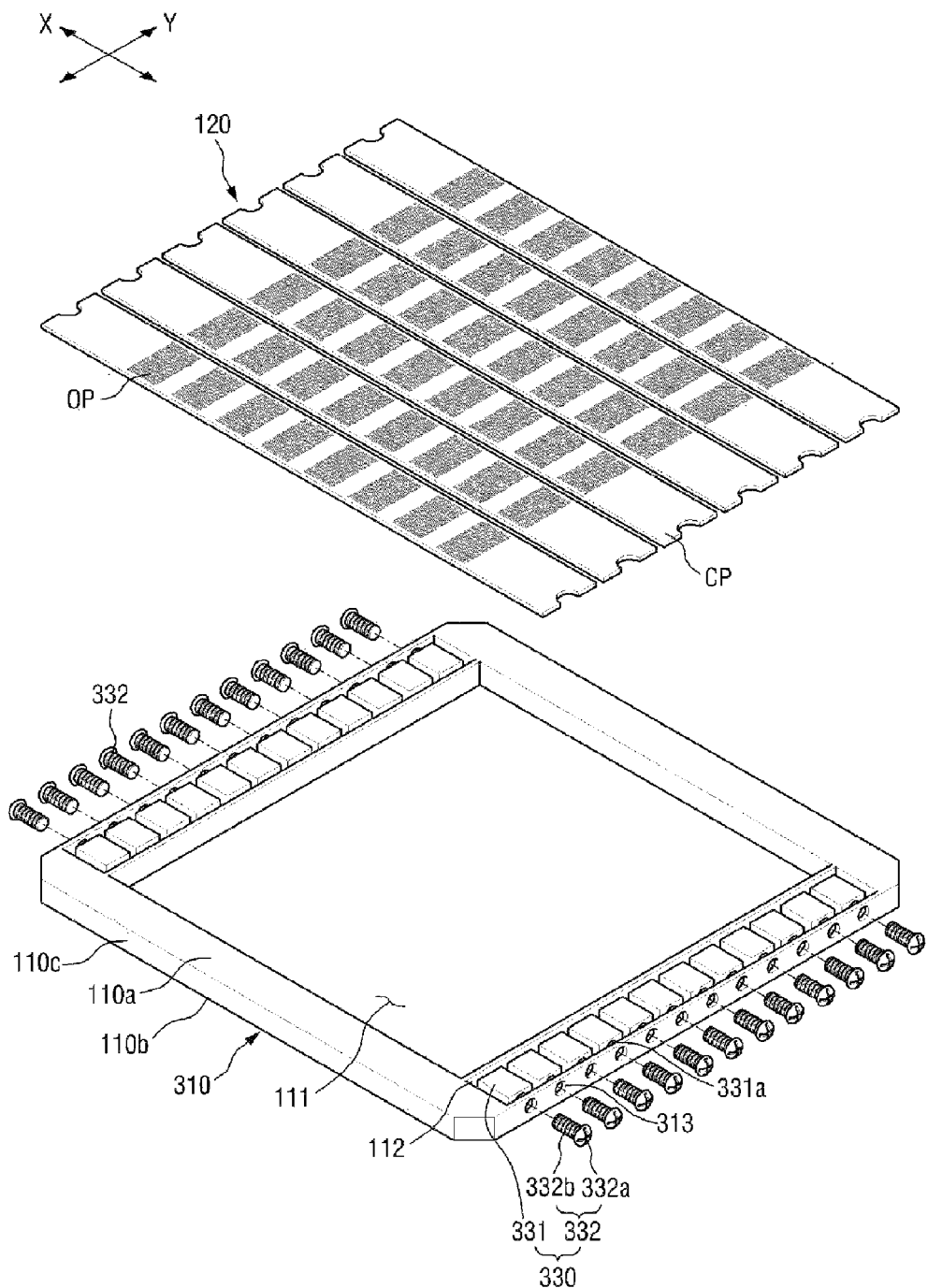
FIG. 16 is a perspective view of the mask assembly of FIG. 15.
Figure 17:
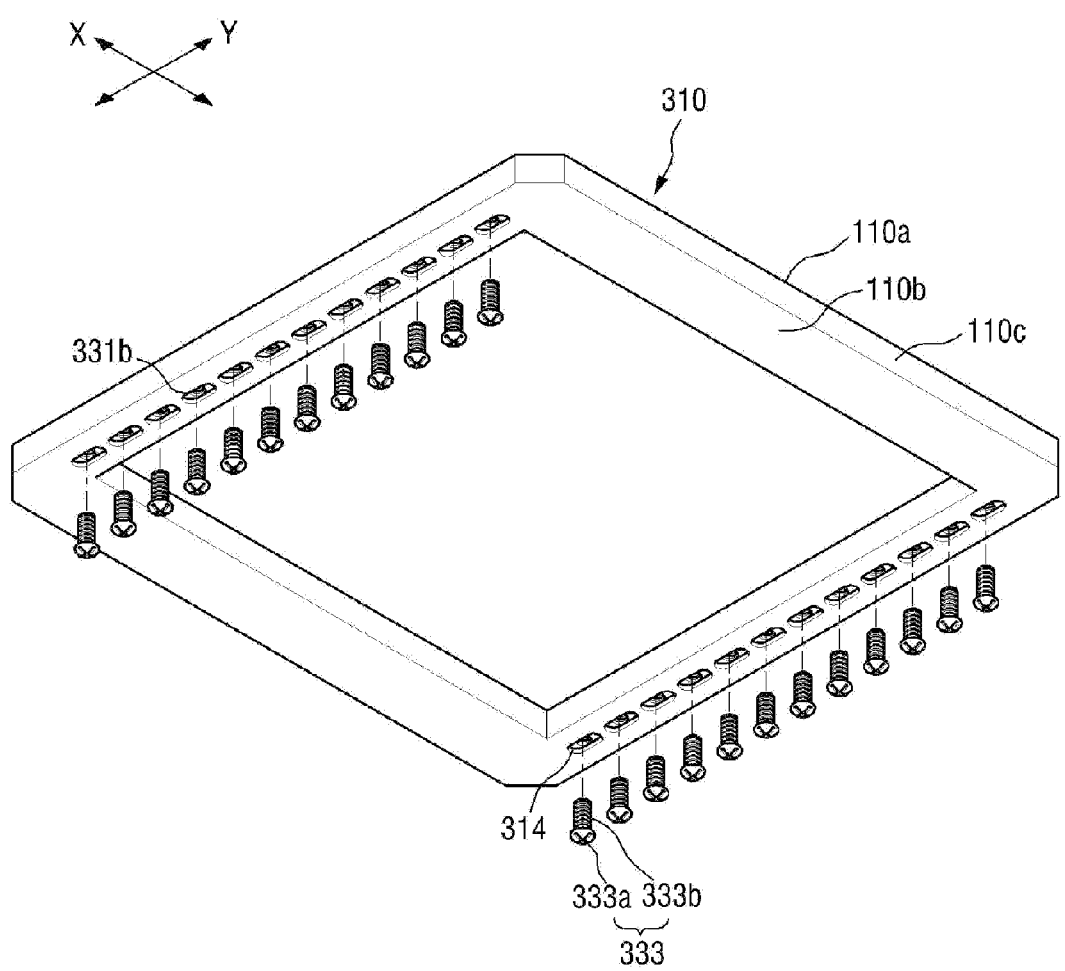
FIG. 17 is a perspective view illustrating a bottom surface of a mask frame of FIG. 16.
Figure 18:
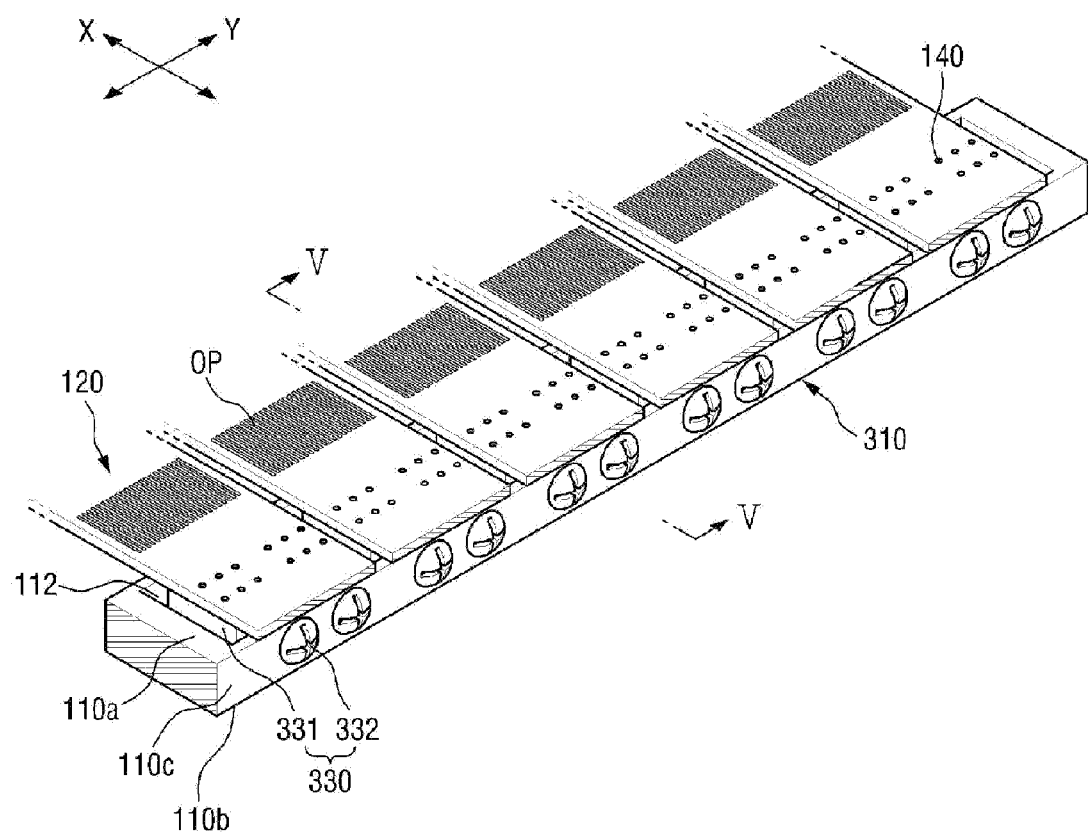
FIG. 18 is an enlarged perspective view of portion "C" of FIG. 15.
Figure 19:
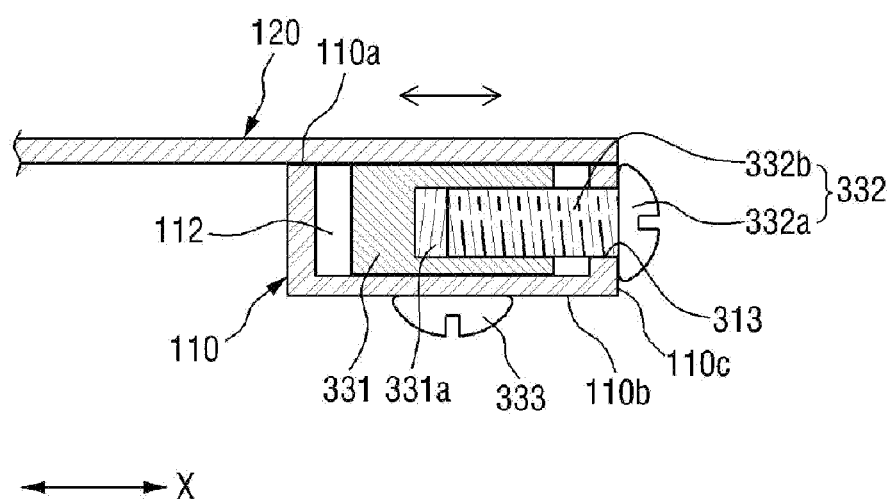
FIG. 19 is a cross-sectional view taken along line V-V of FIG. 18.
Figure 20:
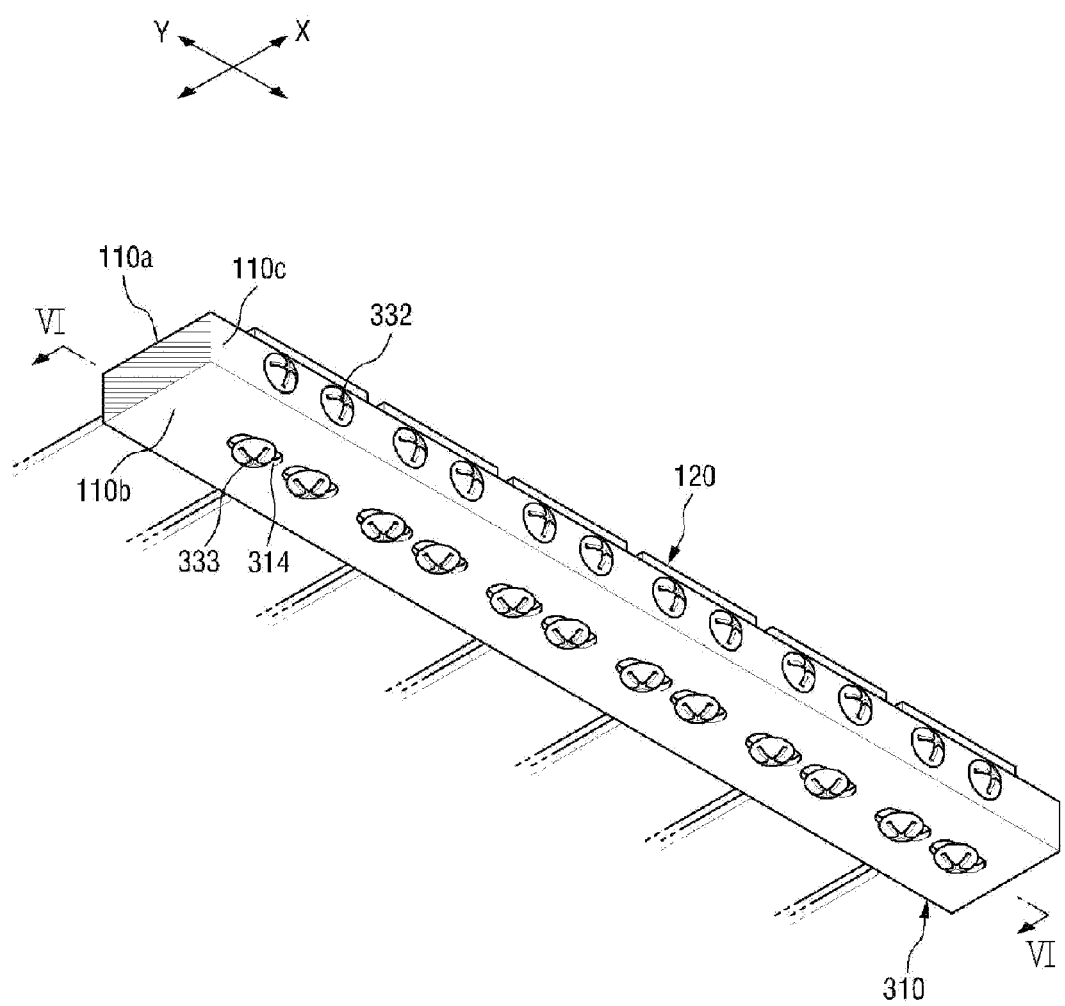
FIG. 20 is an enlarged perspective view illustrating a bottom surface of portion "C" of FIG. 15.
Figure 21:
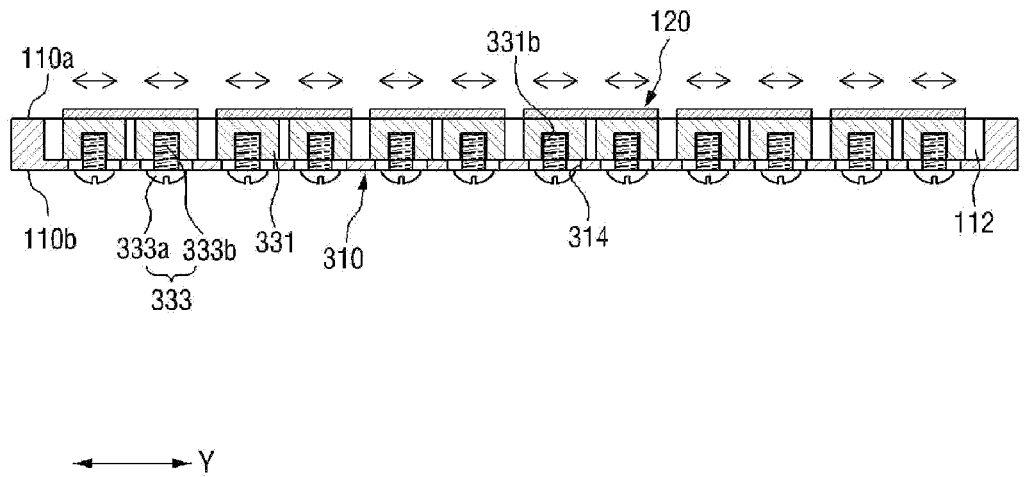
FIG. 21 is a cross-sectional view taken along line VI-VI of FIG. 20.

FIG. 15 is a plan view illustrating a mask assembly according to exemplary embodiments of the present invention. FIG. 16 is a perspective view of the mask assembly of FIG. 15. FIG. 17 is a perspective view illustrating a bottom surface of a mask frame of FIG. 16. FIG. 18 is an enlarged perspective view of portion "C" of FIG. 15. FIG. 19 is a cross-sectional view taken along line V-V of FIG. 18. FIG. 20 is an enlarged perspective view illustrating a bottom surface of portion "C" of FIG. 15. FIG. 21 is a cross-sectional view taken along line VI-VI of FIG. 20.

Referring to FIGS. 15 to 17, the mask assembly 300 according to exemplary embodiments of the present invention may include a mask frame 310, the mask 120, and a movement member 330.

The mask frame 310 is similar to the mask frame 110 of FIG. 1. However, the mask frame 310 may include a plurality of first through holes 313 which may be formed at side surfaces of both sides of the first direction X and a plurality of second through holes 314 which may be formed on bottom surfaces of the both sides of the first direction X. The plurality of first through holes 313 may form a passage through which a plurality of first screws 332 of the movement member 330 pass to be coupled with a side surface of a movement block 331 and the plurality of second through holes 314 may form a passage through which a plurality of second screws 333 pass to be coupled with a bottom surface of the movement block 331.

The movement member 330 fixes the mask 120 on the mask frame 310 and corrects a position of the pattern opening of the mask 120 and may include the movement block 331, the first screw 332, and the second screw 333.

The movement block 331 may be provided in an insulation groove 112 of the mask frame 310. The movement block 331 may be configured by a plurality of divided blocks which is arranged along the second direction Y and may provide a space where both ends of the mask 120 are welded. In this example, when the mask 120 is configured by a plurality of divided masks or one mother mask, the plurality of divided masks and the plurality of divided blocks or one mother mask and the plurality of divided blocks may correspond to each other at a rate of 1:n. For example, as illustrated in FIGS. 15 and 16, when the mask 120 is configured by the plurality of divided masks, the plurality of divided masks and the plurality of divided blocks may correspond to each other at the rate of 1:2. In this example, the plurality of divided blocks may correct the position of the pattern opening for every divided mask on the mask frame 310. Further, one divided mask corresponds to two divided blocks so that the position of the pattern opening of one divided mask is corrected by two divided blocks, which may more finely correct the position of the pattern opening of one divided mask. For example, even when the mask 120 is configured by one mother mask, the plurality of divided blocks may more finely correct the position of a specific portion of one mother mask on the mask frame 310.

Further, a total area of the plurality of divided blocks may be smaller than an area of the insulation groove 112, therefore a space where the plurality of divided blocks moves in the first direction X and the second direction Y in the insulation groove 112 can be provided.

The first screw 332 may include a first head part 332a and a first body part 332b and performs the same function as the first screw 132 of FIG. 2. However, the number of the first screws 332 may be the same as the number of the plurality of divided blocks. Referring to FIGS. 16 and 19, a first coupling groove 331a is provided at a side surface of the movement block 331 so as to be coupled with the first screw 332.

The second screw 333 may include a second head part 333a and a second body part 333b and performs the same function as the second screw 133 of FIG. 2. However, the number of the second screws 333 is the same as the number of the plurality of divided blocks. Referring to FIGS. 17 and 21, a second coupling groove 331b may be provided at a bottom surface of the movement block 331 so as to be coupled with the second screw 333.

As described above, the mask assembly 300 according to exemplary embodiments of the present invention may include a movement member 330 which is provided in the insulation groove 112 of the mask frame 310 and may include a movement block 331 configured by a plurality of divided blocks so as to minutely move each divided mask in the first direction X and the second direction Y by moving each of the plurality of divided blocks to finely correct the position of the pattern opening for every divided mask on the mask frame 310.

As a result, in the mask assembly 300 according to exemplary embodiments of the present invention, when an extending process or a welding process of any one of divided masks is not precisely performed or the divided mask has wrinkles so that a position of the pattern opening of the divided mask minutely deviates from a predetermined position on the mask frame 310, the position of the pattern opening of the divided mask may be finely corrected.

Therefore, in the mask assembly 300 according to exemplary embodiments of the present invention, the thin film deposition error of the substrate caused by the deviated position of the pattern opening of the mask 120 may be reduced.

Next, a method of fabricating a mask assembly according to exemplary embodiments of the present invention will be described with the mask assembly 200 of FIGS. 9 to 16.

Figure 22:
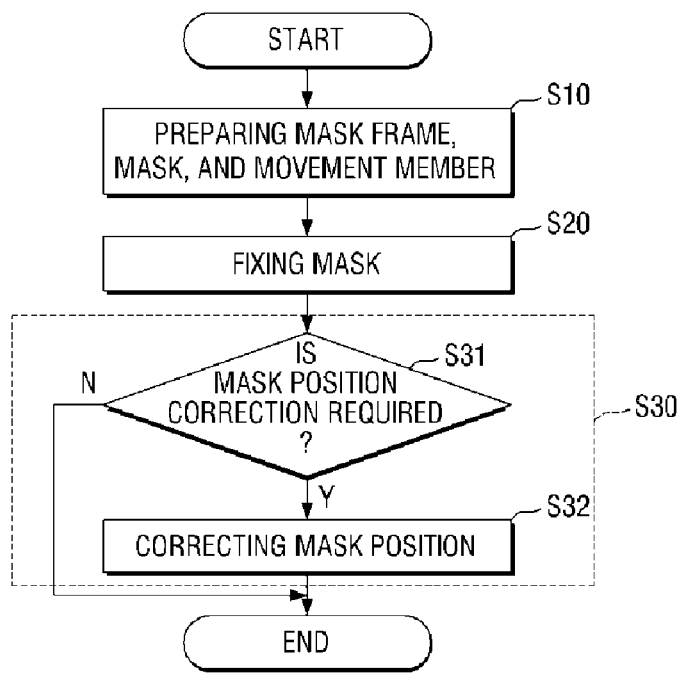
FIG. 22 is a flow chart of a process for illustrating a method of fabricating the mask assembly of FIG. 8.

FIG. 22 is a flow chart of a process for illustrating a method of fabricating the mask assembly of FIG. 8. FIGS. 23 to 27 are diagrams illustrating a method of fabricating the mask assembly of FIG. 22.

Referring to FIG. 22, a method of fabricating a mask assembly according to exemplary embodiments of the present invention may include a mask frame, mask, and movement member preparing step S10, a mask fixing step S20, and a mask position checking step S30.

Figure 23:
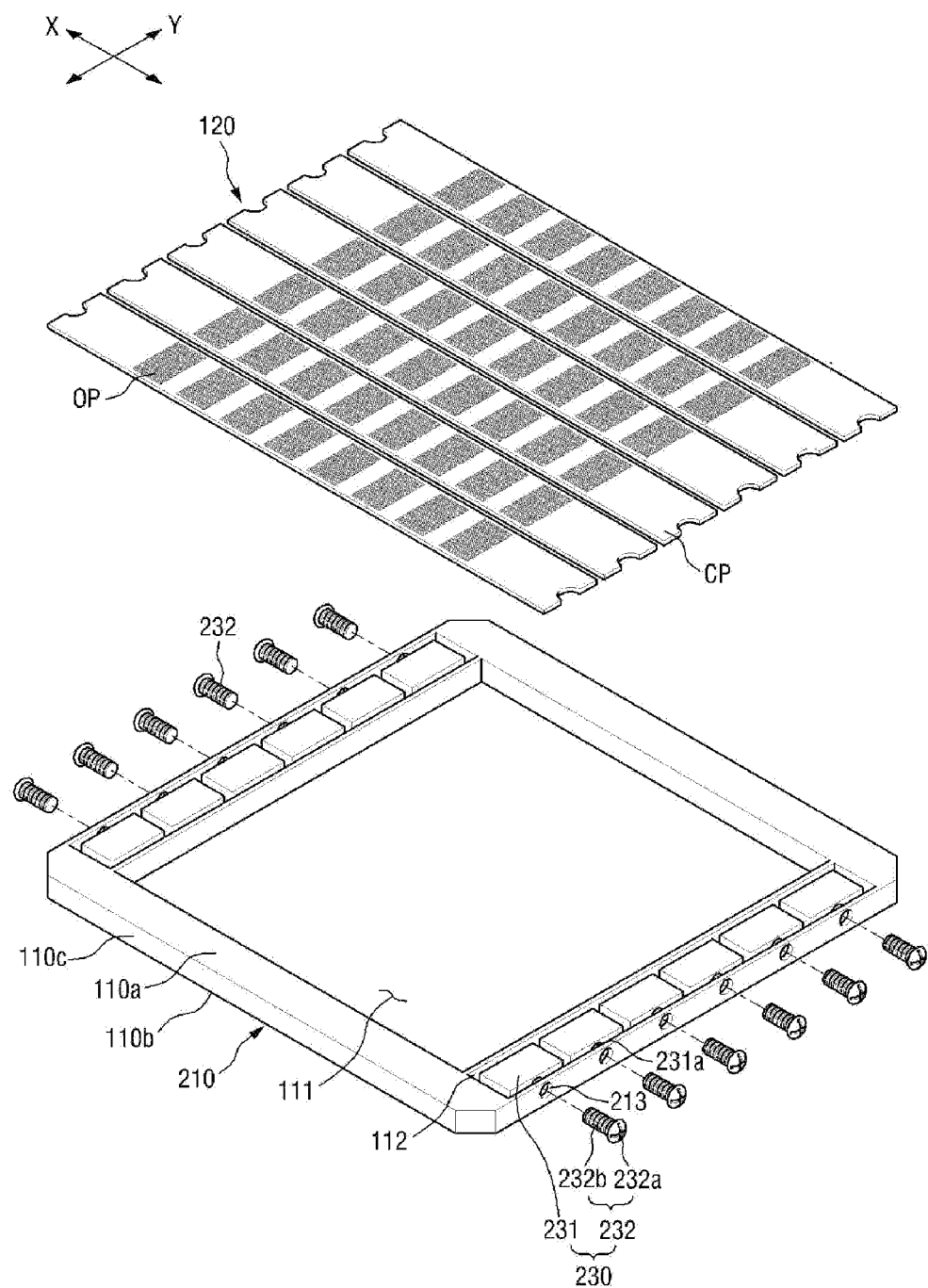
FIGS. 23 to 27 are diagrams illustrating a method of fabricating the mask assembly of FIG. 22.
Figure 24:
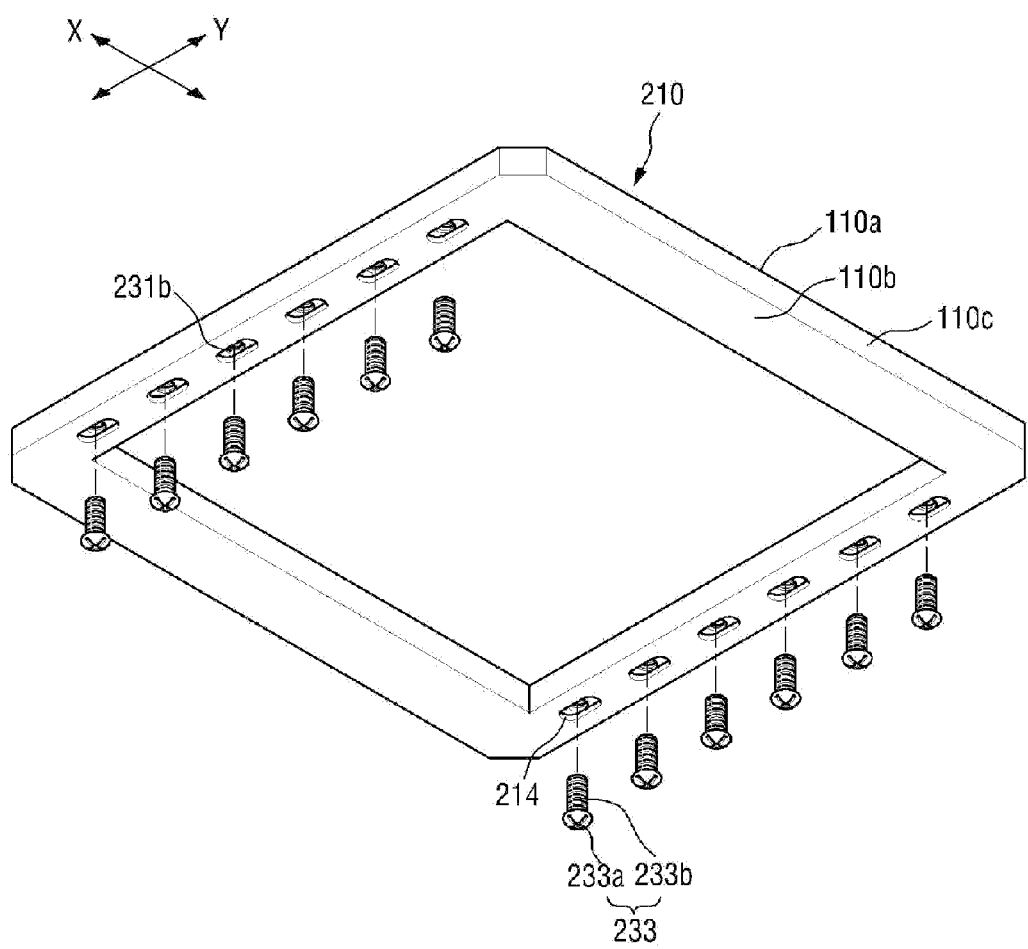

Referring to FIGS. 23 and 24, per step S 10, the mask frame 210, the mask 120, and the movement member 230 are prepared. The mask frame 210 may have a frame opening 111 formed therein and may include insulation grooves 112 which are formed at both sides of a first direction X with the frame opening 111 therebetween. The mask 120 has both ends disposed at two sides of the mask frame 210 in the first direction X and may include a plurality of pattern parts OP configured by a plurality of pattern openings between both ends. The movement member 230 may include a movement block 231 which is provided in the insulation groove 112. Both ends of the mask 120 are fixed to the movement block 231 and the movement block 231 moves in the first direction X and a second direction Y which intersects the first direction X. The mask frame 210, the mask 120, and the movement member 230 have been described above in detail so that the redundant description will not be provided in order to avoid unnecessarily obscuring the present invention.

Figure 25:
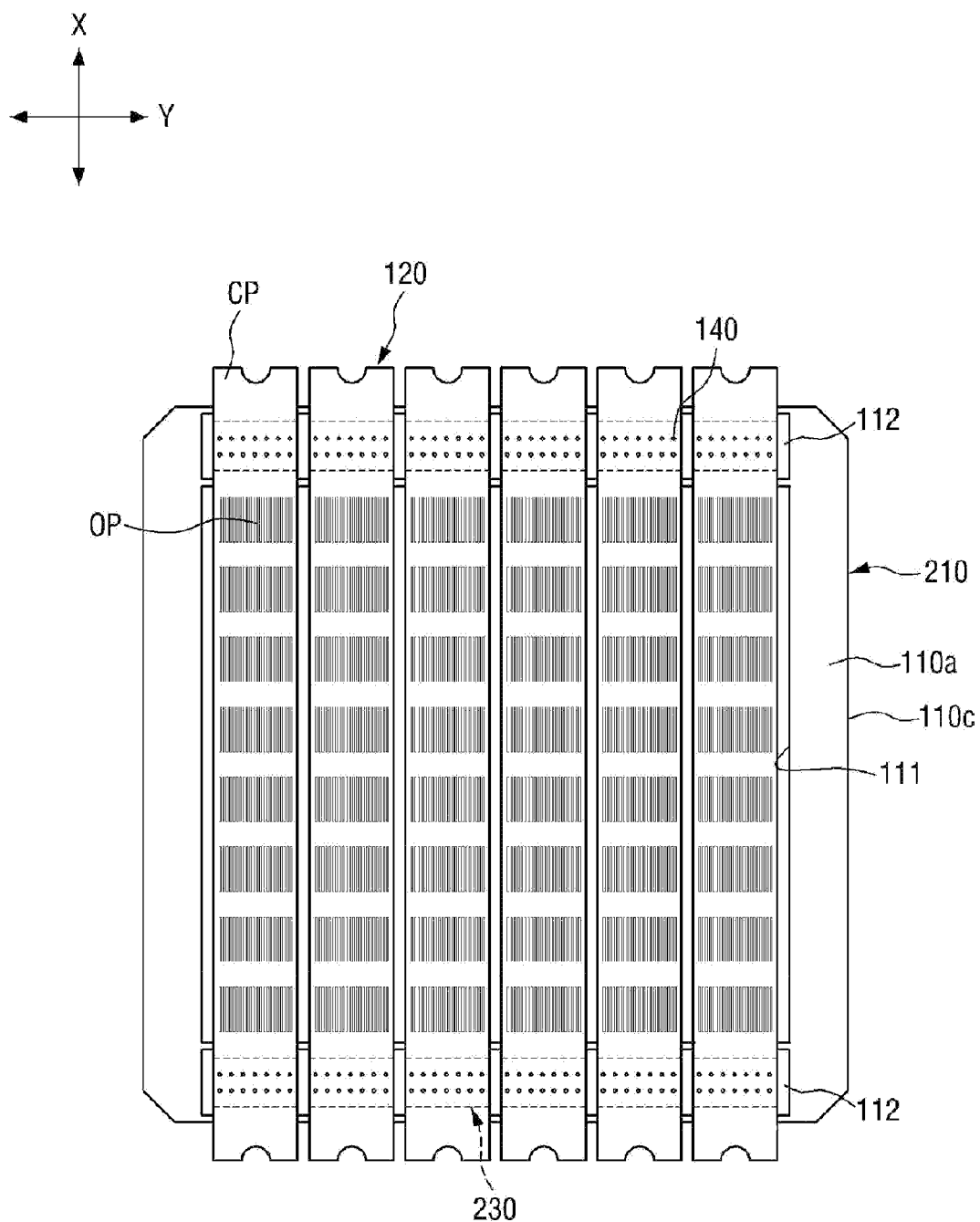

Referring to FIG. 25, in step S20, both ends of the mask 120 are fixed onto the movement block 231 while extending the mask 120 in the first direction X. Both ends of the mask 120 may be welded to be fixed. In this example, a welding part 140 may be formed at both ends of the mask 120.

Figure 26:
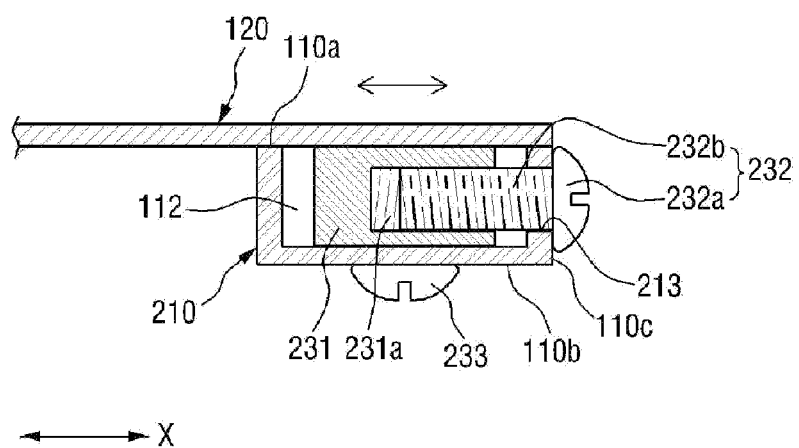
Figure 27:
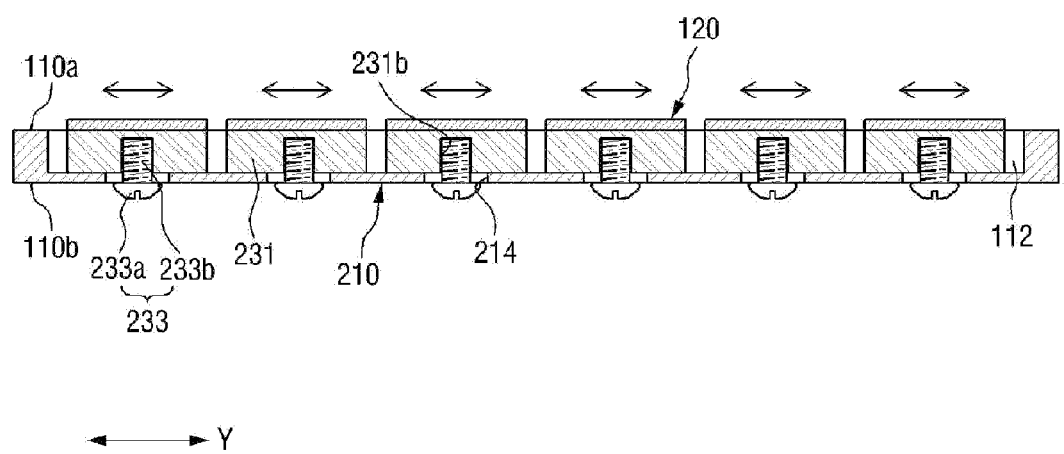

Referring to FIGS. 26 and 27, in step S30, when a pattern opening of the mask 120 is not disposed in a predetermined position on the mask frame 210 to deviate from a predetermined position, the movement block 231 moves in at least one of the first direction X and the second direction Y to correct the position of the pattern opening of the mask 120.

The mask position checking, per step S30 may include a mask position correction determining process S31 and a mask position correcting process S32.

In the mask position correction determining process, per step S31, it is determined whether the position of the pattern opening of the mask 120 is required to be corrected. In the mask position correction determining process, per step S31, for example, a separate alignment measuring device may be used to measure an alignment value for every pattern opening of the mask 120 on the mask frame 210. If a separate controller determines that the alignment value of at least one pattern opening of the mask 120 on the mask frame 210 deviates from a predetermined alignment value, it may be determined that the correction of the position of the pattern opening of the mask 120 is required. In this step, it is determined that the alignment value of at least one pattern opening of the mask 120 deviates from the predetermined alignment value when one pattern opening of the mask 120 does not correspond to one pixel of a substrate (not illustrated) to be disposed at an upper portion of the mask 120.

When it is determined that the correction of the position of the pattern opening of the mask 120 is required in the mask position correction determining process, per step S31, in the mask position correcting process S32, the movement block 231 is moved in the first direction X using the first screw 232 or the movement block 231 is moved in the second direction Y using the second screw 233 to correct the position of the pattern opening of the mask 120.

According to exemplary embodiments of the present invention, there is provided a method of fabricating a mask assembly. The method includes preparing a movement member including a mask frame in which a frame opening is formed therein and insulation grooves are formed at both sides of a first direction with the frame opening therebetween. The mask which has both ends disposed at the both sides and may include a plurality of pattern open parts configured by a plurality of pattern openings between the both ends. A movement member which is provided in the insulation groove, to which the both ends of the mask are fixed, and which includes a movement block moving in the first direction and a second direction intersecting the first direction. The method includes fixing the both ends of the mask to the movement block while extending the mask in the first direction and moving the movement block in at least one of the first direction and the second direction to correct a position of a pattern opening of the mask when the pattern opening of the mask deviates from a predetermined position on the mask frame.

The mask assembly according to exemplary embodiments of the present invention may include a movement member including a movement block which is provided in an installation groove of a mask frame, so that the mask may be moved in a first direction and a second direction by moving the movement block.

Therefore, when an extending process or a welding process of a mask is not precisely performed or the mask has wrinkles so that a position of the pattern openings of the mask is minutely deviates from a predetermined position on the mask frame, for example, one pattern opening of the mask does not correspond to one pixel of a substrate to be disposed on an upper portion of the mask, the mask assembly according to the embodiment of the present invention may correct the position of the pattern opening of the mask.

Accordingly, the mask assembly according to the exemplary embodiments of the present invention may reduce the thin film deposition error of the substrate due to the deviated position of the pattern opening of the mask.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A mask assembly, comprising:
a mask frame comprising a frame opening and grooves disposed at opposite sides of the frame opening in a first direction;
a mask comprising two ends and a plurality of pattern open parts comprising a plurality of pattern openings disposed between the both ends; and
a movement member, disposed in each of the grooves, to which the two ends of the mask are fixed, the movement member comprising a movement block configured to move in both the first direction and a second direction intersecting the first direction,
wherein:
each of the grooves is formed along the second direction and is formed to be recessed from a top surface of the mask frame to a bottom surface of the mask frame, the top surface of the mask frame facing the mask; and
the mask directly contacts the movement block.

2. The mask assembly of claim 1, wherein the mask comprises a plurality of divided masks arranged along the second direction or one mother mask.

3. The mask assembly of claim 1, wherein the movement member further comprises a first screw coupled to a side surface of the mask frame and a side surface of the movement block and a second screw coupled to a bottom surface of the mask frame and a bottom surface of the movement block.

4. The mask assembly of claim 3, wherein the side surface of the mask frame comprises a first through hole through which the first screw passes, the first screw comprises a first head part and a first body part coupled to the first head part to pass through the first through hole, wherein a width of the first through hole in the second direction is equal to or larger than a width of the first body part.

5. The mask assembly of claim 3, wherein the bottom surface of the mask frame comprises a second through hole through which the second screw passes, the second screw comprises a second head part and a second body part coupled to the second head part to pass through the second through hole, wherein a width of the second through hole in the second direction is larger than a width of the second body part.

6. The mask assembly of claim 1, wherein the movement block comprises a plurality of divided blocks arranged along the second direction, wherein a total area of the plurality of divided blocks is smaller than an area of the groove.

7. The mask assembly of claim 6, wherein the mask comprises a plurality of divided masks arranged along the second direction or one mother mask, wherein a ratio of the plurality of divided masks and the corresponding plurality of divided blocks or a ratio of the one mother mask and the corresponding plurality of divided blocks is 1:n (n is a natural number).

8. The mask assembly of claim 6, wherein the movement member further comprises a plurality of first screws coupled to a side surface of the mask frame and side surfaces of the plurality of divided blocks and a plurality of second screws coupled to a bottom surface of the mask frame and the plurality of divided blocks.

9. The mask assembly of claim 8, wherein the side surface of the mask frame comprises a first through hole through which the first screw passes, the first screw comprises a first head part and a first body part coupled to the first head part to pass through the first through hole, wherein a width of the first through hole in the second direction is equal to or larger than a width of the first body part.

10. The mask assembly of claim 8, wherein the bottom surface of the mask frame comprises a second through hole through which the second screw passes, the second screw comprises a second head part and a second body part coupled to the second head part to pass through the second through hole, wherein a width of the second through hole in the second direction is larger than a width of the second body part.

11. The mask assembly of claim 1, further comprising:
a welding part comprising welds fixing the two ends of the mask to the movement block to be fixed.

* * * * *